(12) United States Patent
Khoury et al.

(10) Patent No.: US 7,746,121 B2
(45) Date of Patent: Jun. 29, 2010

(54) ULTRA LOW POWER LVDS DRIVER WITH BUILT IN IMPEDANCE TERMINATION TO SUPPLY AND GROUND RAILS

(75) Inventors: Elie G. Khoury, Gilbert, AZ (US); DC Sessions, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 113 days.

(21) Appl. No.: 11/587,104

(22) PCT Filed: Apr. 19, 2005

(86) PCT No.: PCT/IB2005/051281

§ 371 (c)(1),
(2), (4) Date: Nov. 21, 2007

(87) PCT Pub. No.: WO2005/104374

PCT Pub. Date: Nov. 3, 2005

(65) Prior Publication Data

US 2008/0191784 A1    Aug. 14, 2008

Related U.S. Application Data

(60) Provisional application No. 60/563,452, filed on Apr. 20, 2004.

(51) Int. Cl.
*H03K 3/00* (2006.01)

(52) U.S. Cl. ...................................... 327/108; 327/112

(58) Field of Classification Search ................. 327/108, 327/112

See application file for complete search history.

(56) References Cited

U.S. PATENT DOCUMENTS

| | | | | |
|---|---|---|---|---|
| 5,749,367 | A * | 5/1998 | Gamlyn et al. | 600/509 |
| 5,978,417 | A * | 11/1999 | Baker et al. | 375/232 |
| 6,294,933 | B1 * | 9/2001 | Chun et al. | 326/86 |
| 6,498,511 | B2 * | 12/2002 | Tamura et al. | 326/86 |
| 6,856,177 | B1 * | 2/2005 | de Frutos et al. | 327/108 |
| 7,555,048 | B1 * | 6/2009 | Massoumi et al. | 375/260 |

FOREIGN PATENT DOCUMENTS

| | | |
|---|---|---|
| JP | 03 078313 | 6/1991 |
| JP | 11-17520 A | 1/1999 |

* cited by examiner

*Primary Examiner*—Kenneth B. Wells (57) ABSTRACT

A novel high speed, >1 GHz or 2 Gbits/s, low voltage differential signal (LVDS) driver is disclosed. The LVDS design achieves low power consumption while providing LVDS compliant impedance termination to power supply and ground. An output stage of the LVDS is implemented using a Nmos and a Pmos follower in a push pull configuration. This new design relies first on a follower type of an output stage, which provides the inherent impedance termination, second on an AC, capacitive, coupling and DC restoration to drive output stage gates, and on a low power dummy bias generator that supplies DC restoration voltages. As the supply voltage is lower the thick oxide devices performance suffer, therefore for this new design is mainly implemented with thin oxide devices.

35 Claims, 8 Drawing Sheets

ULTRA LOW POWER LVDS DRIVER WITH BUILT IN IMPEDANCE TERMINATION TO SUPPLY AND GROUND RAILS

CROSS REFERENCE TO RELATED APPLICATION

This application claims the benefit of U.S. provisional application Ser. No. 60/563,452 filed Apr. 20, 2004, which is incorporated herein whole by reference.

FIELD OF THE INVENTION

The invention relates to the field of low voltage differential signaling and more specifically to the field of low power low voltage differential signaling.

BACKGROUND OF THE INVENTION

Low voltage differential signaling (LVDS) is used for communicating data using a very low power differential signal. This differential signal is either used to communicate data using two PCB traces or a balanced cable. A voltage difference is typically under 400 mV for the voltage swing.

Currently, many solutions exist for exchanging digital data on a PCB, however limited solutions exist in exchanging data between devices connected using a cable. Moving this digital data across the cable requires an extremely high-performance solution that consumes minimal power, is relatively immune to noise, inexpensive, and generates little noise. LVDS is advantageous because digital data is transmitted differentially, using two wires with opposite current or voltage swings instead of a single wire. Thus, if common-mode noise couples into the two wires, it is rejected by a receiver circuit since the noise appears on both lines equally and the receiver circuit receives a difference between the two signals. Furthermore, differential signals tend to radiate less noise than single ended signals due to the canceling of magnetic fields.

A typical LVDS differential output signal is specified to be 400 mv (max) into a 100 Ohms load with a common mode voltage (CMV) of 1.2V. Each of the output ports of a LVDS transmitter is terminated to both power and ground rails with a nominal impedance of 50 Ohms. Conventional and somehow advanced techniques that are used in producing of a LVDS compliant driver use differential current mode logic (CML) or a variant on a differential CMOS push/pull driver circuit. In order to achieve a 1.2V CML, the conventional techniques require the use of a high supply voltage. Current submicron integration technology supports voltages that are nominally 3.3V.

Additionally, impedance matching to the power and ground rails is necessary. However, in order to generate the required internal 50 Ohms termination to power and ground, an additional internal current is utilized to produce the required impedance match. This current can range from 3 to 4 times the external load current. For simplicity, for a load of 100 Ohms and 400 mv differential swing, the load current is then 4 mA, which means the wasted internal current is 12-16 mA. This translates into an internal power consumption of $P=V*I$, where the $I=12-16$ ma and $V=*3.3$ v, which leads to wasted power of approximately 39.6 mW to 52.8 mW.

A need therefore exists to provide a LDVS circuit that does not rely on an additional internal current to produce the impedance match between power and ground rails. Alternatively, it would also be advantageous to reduce the power consumption relating to producing the impedance match between power and ground rails. It is therefore an object of the invention to provide a LVDS circuit that provides low power consumption with built in impedance termination to supply and ground.

SUMMARY OF THE INVENTION

In accordance with the invention there is provided a low voltage differential signaling (LVDS) output stage circuit comprising: a first supply voltage port for receiving of a first potential; a second supply voltage port for receiving of a second potential that is lower than the first potential; a differential input port, comprising a first input port and a second input port, for receiving of a differential input signal having transitions between the first and second potentials; a follower output stage formed with a thin oxide semiconductor manufacturing process comprising first and second NMOS pull-up FET devices and first and second PMOS pull-down FET devices disposed between the first and second supply voltage ports for being biased between the first and second potentials; and, a differential output port formed between junctions of the first and second NMOS pull-up FET devices and first and second PMOS pull-down FET devices for providing of a low voltage differential signal therefrom.

In accordance with the invention there is provided a low voltage differential signaling (LVDS) output stage circuit comprising: a first supply voltage port for receiving of a first potential; a second supply voltage port for receiving of a second potential that is lower than the first potential; a differential input port, comprising a first input port and a second input port, for receiving of a differential input signal having transitions between the first and second potentials; a follower output stage comprising first and second NMOS pull-up FET devices and first and second PMOS pull-down FET devices disposed between the first and second supply voltage ports for being biased between the first and second potentials; a differential output port formed between junctions of the first and second NMOS pull-up FET devices and first and second PMOS pull-down FET devices for providing of a low voltage differential signal therefrom; a first set of coupling capacitors disposed between the first input port and gate terminals of the first NMOS pull-up FET device and the first PMOS pull down FET device; a second set of coupling capacitors disposed between the second input port and gate terminals of the second NMOS pull up FET device and the second PMOS pull-down FET device; and, DC restoration circuitry coupled with each of the gate terminals of the FET devices for providing of a DC potential to the first and second sets of coupling capacitors in response to transitions in the differential input signal.

In accordance with the invention there is provided a method comprising: AC coupling of a differential input signal to a follower output stage, the AC coupling performed using higher speed lower voltage devices; DC restoring of a portion of the differential input signal to the follower output stage, the DC restoring performed using slower higher voltage devices; and, summing the AC coupled differential input signal and the DC bias voltage together in the follower output stage to form a differential output signal.

In accordance with the invention there is provided a LVDS output stage circuit comprising: means for AC coupling of a differential input signal to a follower output stage, the AC coupling performed using higher speed lower voltage devices; means for DC restoring of a portion of the differential input signal to the follower output stage, the DC restoring performed using slower higher voltage devices; and, means for summing the AC coupled differential input signal and the DC bias voltage together in the follower output stage to form a differential output signal.

In accordance with the invention there is provided a storage medium for storing of instruction data comprising: first instruction data for AC coupling of a differential input signal to a follower output stage, the AC coupling performed using higher speed lower voltage devices; second instruction data for DC restoring of a portion of the differential input signal to the follower output stage, the DC restoring performed using slower higher voltage devices; and, third instruction data for summing the AC coupled differential input signal and the DC bias voltage together in the follower output stage to form a differential output signal.

BRIEF DESCRIPTION OF THE DRAWINGS

Exemplary embodiments of the invention will now be described in conjunction with the following drawings, in which:

FIG. 6a illustrates an output driver section in accordance with a preferred embodiment of the invention, which utilizes a follower output stage, first and second sets of coupling capacitors, switching devices, and bias voltage generator circuitry; and, FIG. 6b illustrates a level shifting circuit for use with the output driver section shown in FIG. 6a.

DETAILED DESCRIPTION OF EMBODIMENTS OF THE INVENTION

The supply voltage that is used for a majority of IC electronics is 3.3V. Power dissipation is a product of voltage and current, P=IV. Thus, by reducing the supply voltage below 3.3V, the power consumption of the integrated circuit (IC) is reduced linearly. Thus, for state of the art 0.18 micron IC process technology, decreasing the supply voltage from 3.3V to 1.8V reduces the power consumption by approximately 45%. Unfortunately, the reduction in supply voltage potential results in the use of alternative integrated devices. As in many deep submicron technologies, the technology itself supports more than one device type, such as those having thick and thin oxide gates, as well as many power supply domains, such as those for powering 3.3V and 1.8V devices.

Figure 1A:
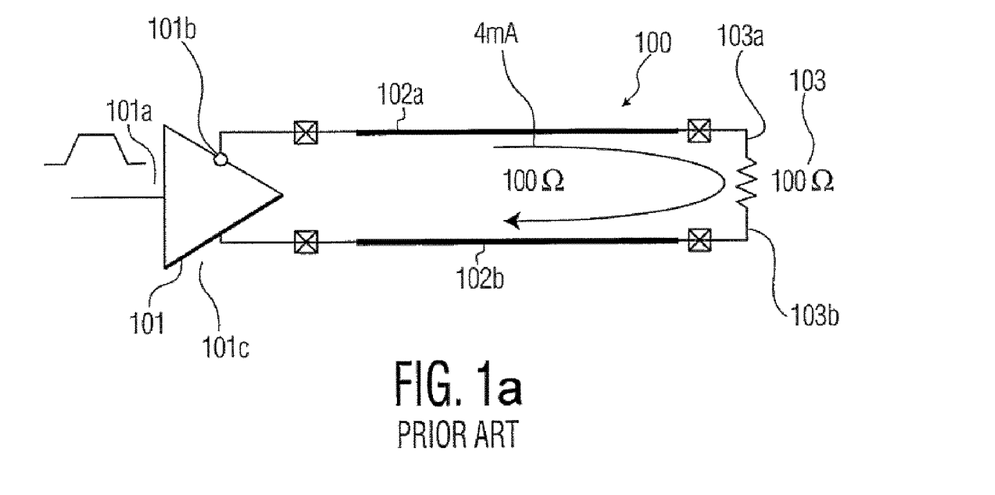
FIG. 1a illustrates a typical low voltage state of the art differential signaling (LVDS) circuit.

FIG. 1a illustrates a typical low voltage state of the art differential signaling (LVDS) circuit 100. The LVDS circuit 100 uses a driver circuit 101 having an input port 101a for receiving of an input signal, which is preferably a rail to rail input signal, and has two ports, 101b and 101c, which are coupled to a dual conductor transmission line, 102a and 102b, at a first end thereof and to a receiver circuit 103 at a second end thereof. The impedance of the dual conductor transmission line is 100Ω so that it is impedance matched to the impedance of the ports, 103a and 103b, on the receiver circuit side, which are also 100 Ω.

In this case, the driver circuit 101 is used to provide a typical 4 mA current into the receiver circuit 103, which is the load with 100Ω port impedance. This current propagates from port 101b, through transmission line 102a, through the receiver circuit ports 103a and 103b and back through transmission line 102b, and back into port 101c of the driver circuit 101.

Figure 1B:
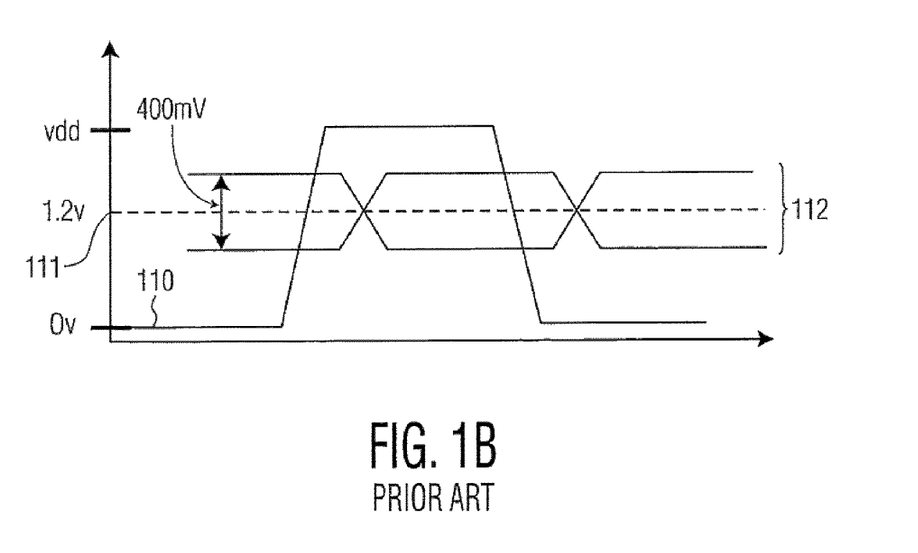
FIG. 1b illustrates typical voltages that are observed on the ports of the driver circuit as well as the input signal that is provided to the input port of the driver circuit.

FIG. 1b illustrates typical voltages that are observed on the ports, 101b and 101c, of the driver circuit 101 as well as the input signal 110 that is provided to the input port of the driver circuit 101. Typically for LVDS specification, a CMV 111 of 1.2V and a 400 mV differential signal 112 are observed. The differential signal is comprised of signals Vout_H and Vout_L, which are provided to input ports, 103a and 103b, of the receiver circuit 103.

Figure 2:
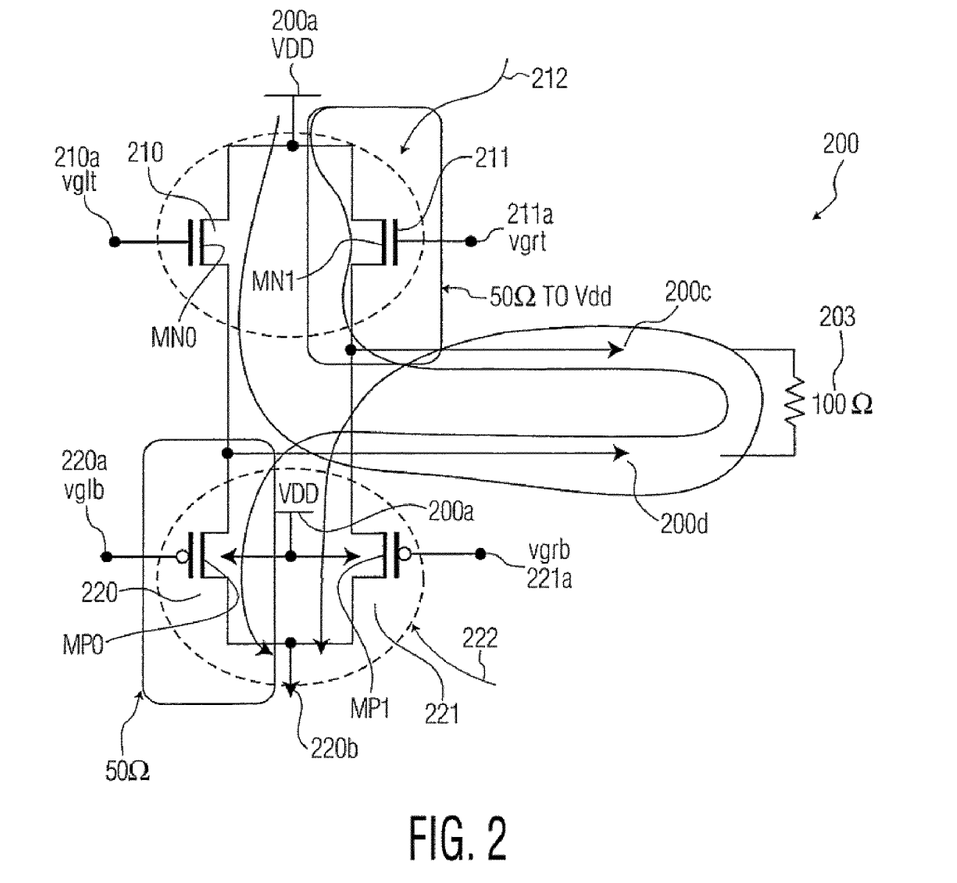
FIG. 2 illustrates a follower output stage, which utilizes first and second circuit branches that are disposed between first and second supply voltage ports for respectively receiving of Vdd and ground potentials.

FIG. 2 illustrates a follower output stage 200, which utilizes first and second circuit branches that are disposed between first and second supply voltage ports, 200a and 200b, for respectively receiving of Vdd and ground potentials. Referring to the first circuit branch, a first NMOS device, MN0 210 is coupled with its drain terminal to the first supply voltage port 200a and with its source terminal to a source terminal of a first PMOS device, MP0 220, with the drain terminal thereof coupled to the second supply voltage port 200b. Referring to the second circuit branch, a second NMOS device, MN1 211, is coupled with its drain terminal to the first supply voltage port 200a and with its source terminal to a source terminal of a second PMOS device, MP1 221, with the drain terminal thereof coupled to the second supply voltage port 200b. A first output port 200c is formed at a junction between the source terminal of device MN1 211 and the source terminal of device MP1 221. A second output port 200d is formed at a junction between the source terminal of device MN0 210 and the source terminal of device MP0 220. A load 203 is coupled with the first and second output ports, 200c and 200d.

The two NMOS devices 212, MN0 210 and MN1 211, function as "pull up" devices and the two PMOS devices 222, MP0 220 and MP1 221, function as "pull down" devices, which are known to those of skill in the art as a follower configuration.

For a typical follower circuit, the follower circuit has a diode characteristic and furthermore the source voltage follows the gate voltage, less the threshold voltage (Vtn) for the NMOS FET devices 210 and 211. So for example, as the gate potential, vglt, applied to the gate terminal 210a of device MN0 210 increases, from ground to Vdd+Vtn, the following occurs for device MN0 210, without any load applied to the output ports 200c and 200d, output signal Out_T is the potential provided to the load 203 from output port 200d.

As vglt <=V(Out_T), device MN0 210 is "hard OFF" and no current flows between the drain and source terminals. When V(Out_T)<=vglt <=V(OutT)+Vtn, device MN0 210 is "OFF" and essentially no current flows between the drain and source terminals. Once V(Out_T)+Vtn <=vglt <=Vdd+Vtn, device MN0 210 is "ON" and V(OutT)=vglt−Vtn, and the device conducts current between its drain and source terminals. For vglt >=Vdd+Vtn device MN0 210 is ON and V(Out_T)=Vdd, where the device conducts current between its drain and source terminals.

Device MP0 220 has a threshold voltage (Vtp). As a gate voltage (vglb) applied to the gate terminal 220a decreases from Vdd to ground level, the following occurs without the load connected to the output ports, 200c and 200d. When vglb >=V(OutT), device MP0 220 is "hard OFF." Also, for V(Out_T)<=vglb <=V(Out_T)–Vtp, device MP0 220 is OFF. Once V(OutT)–Vtp >=vglb >=ground, device MP0 220 is ON and V(Out_T)=vglb+Vtp. Devices MN1 211 and MP1 221 behave similar to that of devices MN0 210 and MP0 220; however, for devices MN1 211 and MP1 221, potentials "vgrt" and "vgrb" are applied to gate terminals thereof, 211a and 221a.

In an active mode of operation for the follower output stage 200, only two devices are ON and conducting current, while the other two are OFF, and are not conducting current. When vglt is HI and vgrb is LO, devices MN0 220 and MP1 221 are ON and when vgrt is LO and vglb is HI, devices MN1 211 and MP0 220 are OFF. In this case, current flows from Vdd 200a through device MN0 210, into the second output port 200d, with a potential of Out_T, through the 100Ω load 203, into the first output port 200c with potential Out_F, into device MP1 221 and finally to ground, 220b. When vglt is LO and vgrb is HI, devices MN0 220 and MP1 221 are OFF and when vgrt is HI and vglb is LO, devices MN1 211 and MP0 220 are ON and the current propagating through the load 203 reverses direction, where current flows from the first supply port 200a, Vdd, through device MN1 211 into the first output port 200c with a potential of Out_F through the 100Ω load 203 into the second output port 200d with potential Out_T into device MP0 220 and finally to ground, which is the second supply voltage port 220b.

For maintaining of output signal integrity on the output ports 200c and 200d, LVDS specification specifies 50Ω impedance between port 200c and the first supply voltage port 200a and between port 200d and the second supply voltage port 200b. This is facilitated by the design of the driver circuit 200 because the driver circuit 200 is resistive in nature and dynamic and static impedances thereof are similar. Thus, device MN1 211 provides a 50Ω impedance to first supply voltage port 200a, Vdd, and device MP0 220 provides a 50Ω impedance to the second supply voltage port 200b, ground. For this circuit example, NMOS and PMOS devices are used because static and dynamic impedance thereof are controllable.

Figure 3A:
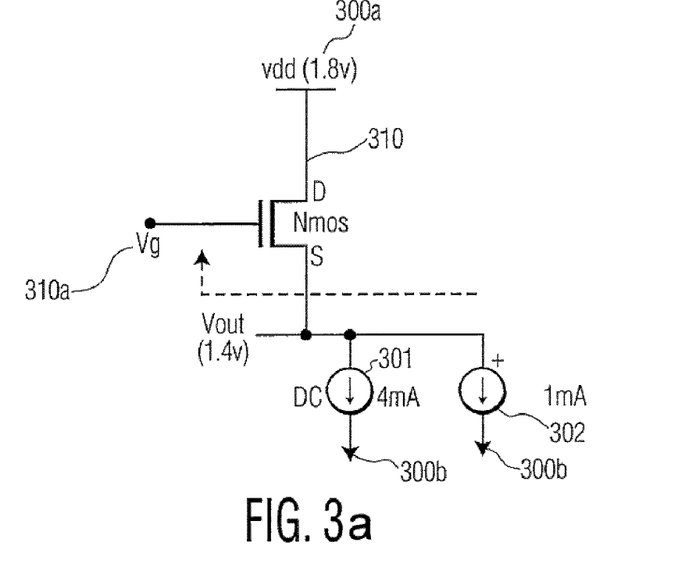
FIGS. 3a and 3b illustrate two circuit models that are used to optimize the source terminal impedance for the pull-up devices and pull-down devices shown in FIG. 2.
Figure 3B:
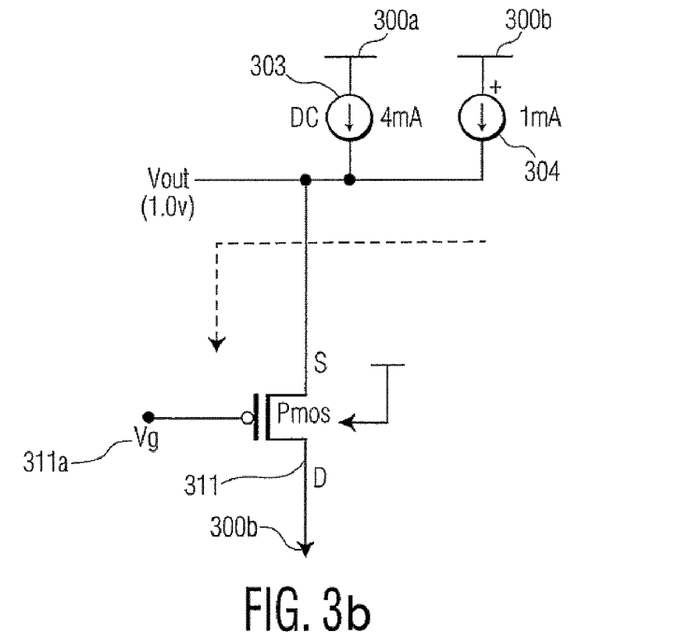

FIGS. 3a and 3b illustrate two circuit models that are used to optimize the source terminal impedance for the pull-up devices, 210 and 211 (FIG. 2), and pull-down devices, 220 and 221 (FIG. 2). FIG. 3a illustrates a model for a NMOS device 310 and FIG. 3b illustrates a model for a PMOS device. For a NMOS follower device, such as FET devices 210 and 211, for a given source current, which in this case is approximately 4 mA, a NMOS device size exists that has a width (W) and length (L) that has a relatively constant source impedance of 50Ω that over a small range of noise injected current with a fixed dynamic impedance.

Referring to FIG. 3a, the NMOS device 310 is coupled with its drain terminal to a first supply voltage port 300a for receiving of Vdd and its source terminal is coupled to a DC current source 301 and to a noise current source 302, both current sources are then further coupled to the second supply voltage port 300b. The DC current source 301 is for providing a DC current of approximately 4 ma to the source terminal of the NMOS device 310. The noise current source is for providing of a noise injection of approximately 1 ma to the source terminal of the NMOS device 310.

For the specific current loading of the NMOS device 310 from both current sources, the width (W) of the NMOS device 310 and a maximum gate voltage are adjusted in order to attain the relatively constant 50Ω source impedance for the device 310. For this device, the length (L) is typically fixed. Thus, in this example, for Vdd=1.8V and for a gate potential of 2.4V applied to the gate terminal 310a, the device 310 is ON. For the same Vdd and a gate potential of 1.6V applied to the gate terminal 310a, the device 310 is OFF. This results in W=98 microns and L=0.4 microns for the NMOS device 310.

Similarly, for the PMOS device shown in FIG. 3b, a width and a gate potential for the device are found that result in relatively constant 50Ω source impedance. Referring to FIG. 3b, the PMOS device 311 is coupled with its drain terminal to a second supply voltage port 300b for receiving of a ground potential and its source terminal is coupled to a DC current source 303 and to a noise current source 304, both current sources are then further coupled to the first supply voltage port 300b. The DC current source 303 is for providing a DC current of approximately 4 ma to the source terminal of the PMOS device 311. The noise current source 304 is for providing of a noise injection of approximately 1 ma to the source terminal of the PMOS device 311. Additionally, the PMOS device 311 is formed on a semiconductor substrate portion that is provided with a bias voltage that is either Vdd or other than Vdd.

For the specific current loading of the PMOS device 311 from both current sources, the width (W) of the PMOS device 311 and a maximum gate voltage are adjusted in order to attain the relatively constant 50Ω source impedance. For this device, the length (L) is typically fixed. Thus, in this example, for Vdd=1.8V and for a gate potential of 0V applied to the gate terminal 311a, the device 311 is ON. For the same Vdd and a gate potential of 0.8V applied to the gate terminal 311a, the device 310 is OFF. This results in W=272 microns and L=0.4 microns for the PMOS device 311. The widths and lengths for the NMOS and PMOS devices, 310 and 311, are for a 0.18 micron technology used to fabricate these devices and may vary for other processes. For Nwell PMOS devices, a Nwell potential is biased at other than the regular Vdd potential, such as when the minimum gate voltage is lower than ground, in order to control the impedance of the PMOS follower device.

Figures 3C, 4A:
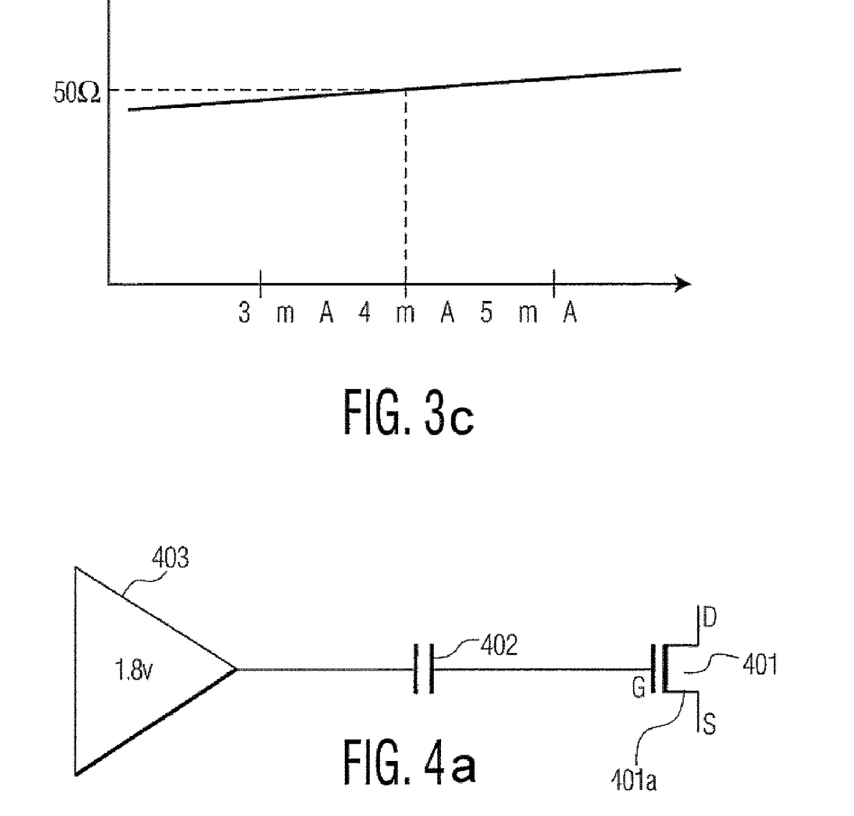
FIG. 3c illustrates a variation in impedance for various DC currents applied to the source terminals of the NMOS and PMOS devices shown in FIGS. 3b and 3c, where for a DC bias current of 4 ma, the impedance is approximately 50Ω.
FIGS. 4a through 4c illustrate an apparatus for providing capacitive coupling of a predriver circuit, using a coupling capacitor, to a gate terminal of an output FET device.

Referring to FIG. 3c, for various DC currents applied to the source terminals of the NMOS and PMOS devices, 310 and 311, the variation in impedance is shown, where for a DC bias current of 4 ma, the impedance is approximately 50Ω. The impedance decreases for lower DC bias currents and increases for higher DC bias currents. Alternatively, the impedance increases for lower DC bias currents and decreases for higher DC bias currents.

The LVDS is preferably a high-speed device, with operating speeds that are greater than 2 Gbits/s. Thus, it is beneficial to have a predriver circuit that is capable of driving the output FET devices, 210, 211, 220 and 221 (FIG. 2) at least at that desired frequency. Additionally, because of the known switching characteristics of the output FET devices 210, 211, 220 and 221 (FIG. 2) and the high speed requirement thereof, preferably the gate terminals of these devices are designed to be provided with input signals that are other than rail to rail having voltage swing characteristics selected to support high speed operation thereof. As explained for FIG. 3a, for a supply voltage of 1.8V, the NMOS device 310 is ON at 2.4V, which is higher than 1.8V.

In order to supply a 1.6V to 2.4V switching voltage for switching of the FET devices in a voltage supply domain of 1.8V, optionally a 3.3V supply domain is implemented; however, with this 3.3V supply domain, thicker oxide, and thus slower FET devices are used. Additionally, circuit design is used for implementing desired switching effects for the FET devices. Since global implementation of thicker oxide devices typically reduces overall maximum operating speed of the LVDS, preferably a combination of thick and thin oxide devices is implemented.

Figure 4B:
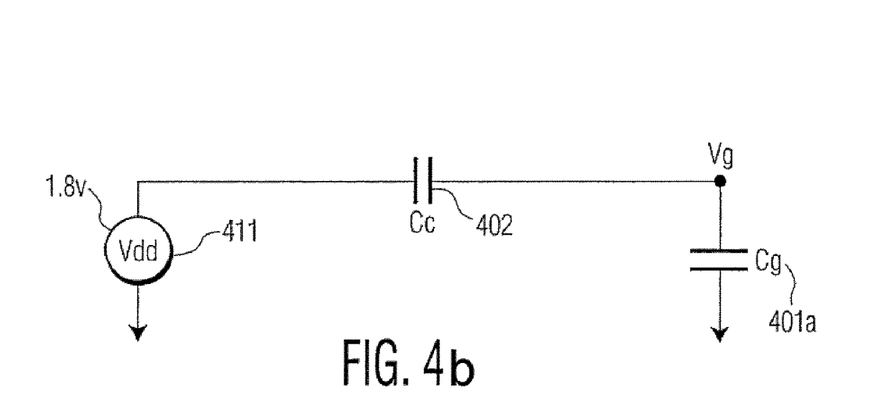

Referring to FIG. 4a, an apparatus is shown that provides capacitive coupling of a predriver circuit 403, using a coupling capacitor 402 coupled to the gate terminal of an output FET device 401. The predriver circuit is a capable of providing a maximum 1.8V signal from its output port. FIG. 4b illustrates a portion of the circuit shown in FIG. 2, where a first voltage source 411 provides a potential of 1.8V through the Cc 402 to the gate terminal of the FET device 401, which is a gate capacitor Cg 401a. The potential on the gate terminal (Vg) of the FET device 401, for an output voltage (Vout), is: Vg=Vdd*(Cc/(Cg+Cc)) or Cc=Vg*Cg/(Vdd-Vout), where for Vdd=1.8 v and Vg=0.8 v, Cc=0.8*Cg, or Cc is 80% the size of Cg.

In using of AC coupled gate terminal for the FET device 401, DC restoration of the gate voltages for the FET devices is implemented. As shown in FIGS. 3a and 3b, two different gate voltages are used for each of the NMOS and PMOS devices, 310 and 311, in order to turn these devices ON and OFF. The NMOS device 310 uses a 2.4V potential to turn it ON and a 1.6V potential to turn it OFF. The PMOS device 311 uses a 0V potential to turn it ON and a 0.8V potential to turn if OFF. For a 1.8V supply voltage environment, DC restoration of the gate potential for the FET devices, 311 and 310, is implemented, otherwise attaining the 2.4V gate voltage is not feasible when using a 1.8V predriver circuit. Without using such a circuit, the NMOS device would never turn ON.

Figure 4C:
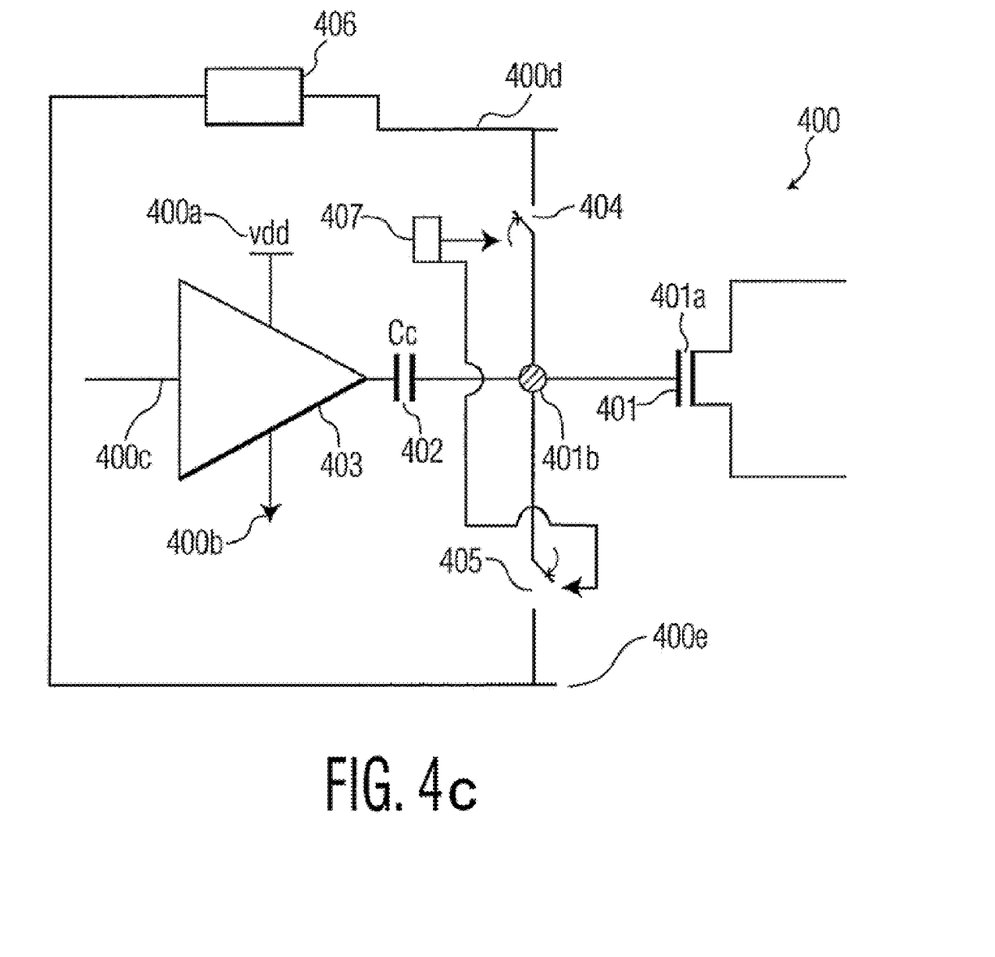

Referring to FIG. 4c, a DC restoration circuit 400 is used in conjunction with the AC coupled FET device in order to enable the FET device to be turned ON and OFF using the 1.8V predriver circuit 403. The DC restoration circuit 400 includes the coupling capacitor (Cc) 402 that is disposed between an output port of a predriver circuit 403 and a first junction 401b that is electrically coupled with the gate terminal of the FET device 401. The predriver circuit 303 is provided with an input port 400c for receiving of a digital input signal and is disposed between a first supply voltage port 400a and the second supply voltage port 400b.

In order to prevent leakage of current from the gate terminal of the FET device 401, during long periods of inactivity, switching circuitry is used. The switching circuitry includes a first switch 404 and a second switch 405 electrically coupled with the first junction 401b and the gate terminal of the FET device 410. The first switch 404, in the form of an integrated CMOS switch, is disposed between a first bias port 400d and the first junction 401b. A second switch 405, in the form of an integrated CMOS switch, is disposed between a second bias port 400e and the first junction 401b. A control circuit 407 is used to control each of the switches, 404 and 405, for opening and closing thereof. Preferably a potential of the third voltage port 400d is higher than that of the fourth voltage port 400e.

The potentials provided to the first and second bias ports, 400d and 400e, are generated by a low power reference bias circuit 406, which is preferably in the form of a charge pump circuit. Optionally, the potentials provided to the first and second bias ports, 400d and 400e, are generated by a higher voltage supply. The voltage swing is predetermined by the Cc 402 and Cg 401a ratios during design of the circuitry 400.

In use, the first switch 404, or the upper switch, is used for providing of the first bias voltage to the gate terminal of the FET device 401 in order to precharge the gate terminal of the FET device 401 with an upper voltage limit when the gate terminal is provided with a logic HI signal. The second switch 405, or lower switch, is used for providing of a second bias voltage to the gate terminal of the FET device 401 for discharging of the gate terminal of the FET device 401 when the gate terminal is provided with a logic LO signal.

Since a 2.4V potential is provided to the gate terminal of the NMOS FET device, 210 or 211, to turn it ON, and this potential is higher than the supply voltage of 1.8V, another supply voltage of, for example, 3.3V is used, which preferably co-exists on a same semiconductor die. In order to supply the potentials for the DC restoration circuit 400, a very low current dummy output stage is used in a feed back loop as shown in FIG. 5.

Figure 5:
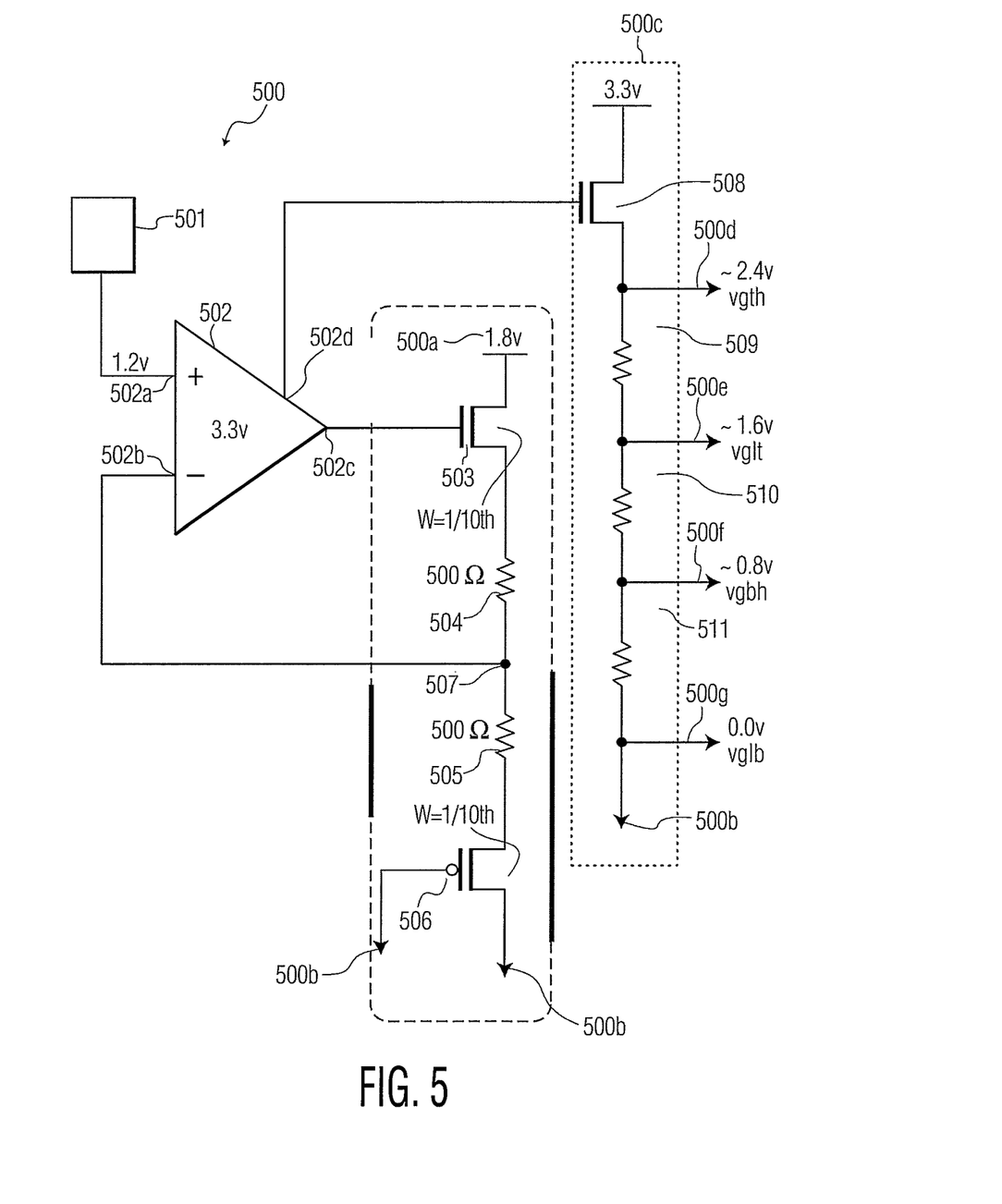
FIG. 5 illustrates a dummy output stage, which is about 1/10 the size of an actual output stage, which is used for generating of first and second bias voltages that are used in conjunction with the DC restoration circuit shown in FIG. 4c.

Referring to FIG. 5, symbolic representation of a dummy output stage is shown, as is appreciated by those of skill in the art. This circuit embodies a concept of a generator circuit for generating of a plurality of different potentials. This dummy output stage, which is about 1/10 the size of an actual output stage, is used for generating of first and second bias voltages that are used in conjunction with the DC restoration circuit shown in FIG. 4c. A reference voltage of 1.2V is provided from a reference voltage source 501 to a positive input port 502a of an operation amplifier (OpAmp) 502. Preferably, the reference voltage source 501 is in the form of a highly stable internal bandgap reference voltage source. A first output port 502c of the OpAmp 502 is coupled with a gate terminal of a first NMOS device 503. The first NMOS device is disposed in series with a first resistor 504, a second resistor 505 and source and drain terminals of a first PMOS device 506, where the drain terminal of the first NMOS device 503 is coupled with a first supply voltage port 500a for receiving of a potential of 1.8V. A first node 507, formed at a junction between the two resistors 504 and 505, is coupled with a negative input port 502b of the OpAmp 502. The 100Ω load that was previously shown in FIG. 1a is replaced with two 500Ω resistors, which are the first and second resistors, 504 and 505. The potential on the first node 507 represents an output common mode voltage (CMV) voltage of approximately 2.4V, which is obtained by continuous comparison by the OpAmp 502 to the reference voltage of 1.2 v. This OpAmp 502 creates the CMV of 1.2V on the first node 507 by biasing of the gate potential of the NMOS device 503 to approximately 2.4V. Electrical devices 503, 504, 505 and 506 are all thin oxide devices because they operate on 1.8V and thus consume approximately 1/10 the current of an actual output stage.

A second output port 502d of the OpAmp 502 is coupled with a second NMOS device 508, where the source terminal thereof is coupled to a third supply voltage port 500c for receiving of a supply voltage of 3.3 V. The drain terminal of this NMOS device 508 is coupled in series with resistors 509, 510 and 511, with resistor 511 being coupled to a second supply voltage port 500b, which is grounded. Bias voltage ports 500d, 500e, 500f, and 500g, which are respectively formed at junctions between NMOS device 508 and resistor 509, resistors 509 and 510, resistors 510 and 511 and resistor 511 and the second supply voltage port 500b, provide bias voltages of vgth, vglt, vgbh and vglb, having potentials of approximately 2.4V, 1.6V, 0.8V and 0.0V in response to a current mirroring operation of Op Amp 502. Of course, generating of these bias voltages of 2.4V, 1.6V, 0.8V, and 0.0V is optionally performed in another manner and is not limited to the circuit that is disclosed herein FIG. 6a, in accordance with a preferred embodiment of the invention, illustrates an output driver section 600 that utilizes a follower output stage 601, first and second sets of coupling capacitors, 602a and 602b, DC restoration circuitry, 603a and 603b, and bias voltage generator circuitry (shown in FIG. 5). The follower output stage 601 is comprised of first and second circuit branches that are disposed between first and second supply voltage ports, 600a and 600b, for respectively receiving of Vdd, 1.8V, and ground potentials. Referring to the first circuit branch, a first NMOS device, MN0 610 is coupled with its drain terminal to the first supply voltage port 600a and with its source terminal to a source terminal of a first PMOS device, MP0 620, with the drain terminal thereof coupled to the second supply voltage port 600b. Referring to the second circuit branch, a second NMOS device, MN1 611 is coupled with its drain terminal to the first supply voltage port 600a and with its source terminal to a source terminal of a second PMOS device, MP1 621, with the drain terminal thereof coupled to the second supply voltage port 600b. A first output port 600d is formed at a junction between the source terminal of device MN1 611 and the source terminal of device MPI 621. A second output port 600e is formed at a junction between the source terminal of device MN0 610 and the source terminal of device MP0 620. The two NMOS devices, MN0 610 and MN1 611, function as "pull up" devices and the two PMOS devices, MP0 620 and MP1 621, function as "pull down" devices. A load 604 is coupled with the first and second output ports 600d and 600e. Preferably the load has an impedance of 100Ω. The first supply voltage port 600a is for receiving of a potential of 1.8V, the second supply voltage port 600b is grounded and the third supply voltage port 600c is for receiving of a potential of 3.3V.

Figure 6A:
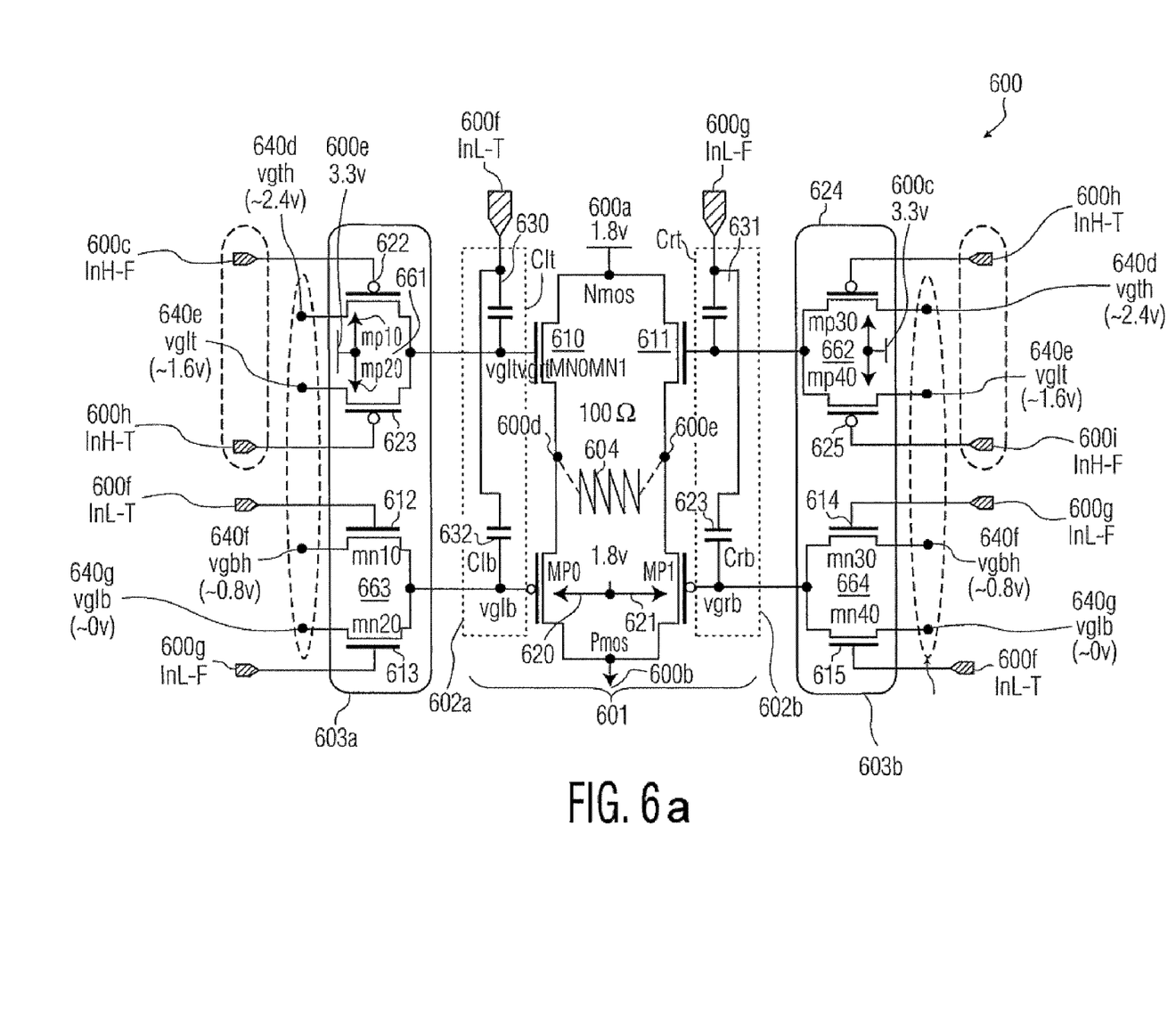

The first set of coupling capacitors 602a includes a coupling capacitor 630 disposed between the gate terminal of device MN0 610 and a first input port 600f, for receiving of signal InL_T, and a coupling capacitor 632 disposed between the first input port 600f and the gate terminal of device MP0 620. The second set of coupling capacitors 602b includes a coupling capacitor 631 disposed between the gate terminal of device MN1 611 and a second input port 600f, for receiving of signal InL_F, and a coupling capacitor 633 disposed between the second input port 600g and the gate terminal of device MP1 621.

The DC restoration circuitry, 603a and 603b, is coupled with each of the gate terminals of the FET devices, 610, 611, 621 and 622 for providing of a DC potential to the first and second sets of coupling capacitors, 602a and 602b. A first DC restoration circuit 661 comprises PFET devices MP10 622 and MP20 623, which are used for DC potential restoration of the coupling capacitor 630, have their drain terminals coupled together, and coupled with coupling capacitor 630 and the gate terminal of device MN0 610. PFET devices MP10 622 and MP20 623 are disposed on a common substrate portion, where the common substrate portion is coupled with the third supply voltage port 600c. Source terminals of the PFET devices MP10 622 and MP20 623 are respectively coupled to bias ports 640d and 640e for respectively receiving of voltages vgth and vglt, 2.4V and 1.6V. Gate terminals of devices MP10 622 and MP20 623 respectively form fourth and third input ports, 600i and 600h, for receiving of signals InH F and InH_T.

A second DC restoration circuit 662 comprises PFET devices, MP30 624 and MP40 625, that are used for DC restoration of the coupling capacitor 631 and have their drain terminals coupled together and with coupling capacitor 631 and the gate terminal of device MN1 611. PFET devices MP30 624 and MP40 625 are disposed on a common substrate portion, where the common substrate portion is coupled with the third supply voltage port 600c. Source terminals of the PFET devices MP30 624 and MP40 625 are respectively coupled to bias ports 640d and 640e for receiving of voltages vgth and vglt, 2.4V and 1.6V, respectively. Gate terminals of devices MP30 624 and MP40 625 respectively form third and fourth input ports, 600h and 600i, for receiving of signals InH_T and InH_F.

A third DC restoration circuit 663 comprises NFET devices MN10 612 and MN20 613, which are used for DC restoration of the coupling capacitor 632, and have their source terminals coupled together and with coupling capacitor 632 and the gate terminal of device MP0 620. Drain terminals of the NFET devices MN10 612 and MN20 613 are respectively coupled to bias ports 640f and 640g for receiving of voltages vgbh and vglb, 0.8V and 0.0V, respectively. Gate terminals of devices MN10 612 and MN20 613 are respectively coupled with the first and second input ports, 600f and 600g, for receiving of signals InL_T and InL_F.

A fourth DC restoration circuit 664 comprises NFET devices MN30 614 and MN40 615, which are used for DC restoration of the coupling capacitor 633, and have their source terminals coupled together and with coupling capacitor 633 and the gate terminal of device MP1 621. Drain terminals of the NFET devices MN30 614 and MN40 615 are respectively coupled to bias ports 640f and 640g for receiving of voltages vgbh and vglb, 0.8V and 0.0V, respectively. Gate terminals of devices MN30 614 and MN40 615 are respectively coupled with the second and first input ports, 600g and 600f, for receiving of signals InL_F and InL_T.

Preferably, the symbolic circuit shown in FIG. 5 is used for providing of the bias voltages to the circuit shown in FIG. 6a. Thus, bias port 500d is coupled with bias port 640d, bias port 500e is coupled with bias port 640e, bias port 500f is coupled with bias port 640f and bias port 500g is coupled with bias port 640g. In this manner, the voltages vgth, vglt, vgbh and vglb, and respective potentials of 2.4V, 1.6V, 0.8V and 0.0V are provided to the bias ports of the output driver section 600 for biasing thereof.

A single switching event for the output driver section 600 is detailed hereinbelow. In an initial, first state, signal InL-T, provided to the first input port 600f, is LO and signal InL_F, provided to the second input port 600g, is HI and in a second state, InL_T=HI and InL_F=LO. During the first state, the following conditions are true:

vglt=~1.6 v since InH_T is LO and InH_F is HI, therefore FET MN0 610 is not conducting;

vgrb=~0.8 v since InL_T is LO and InL_F is HI, therefore FET MP1 621 is not conducting;

vgrt=~2.4 v since InH_T is LO and InH_F is HI, therefore FET MN1 611 is conducting; and vglb=0.0 v since InL_T is LO and InL_F is HI, therefore FET MP0 610 is conducting.

Therefore during the first state current flows from first voltage supply port 600a, the 1.8 v supply, into device MN1 611 through port 600e, out_F, into the external 100Ω load 604, back into port 600d, out_T, into device MP0 620, then to the second supply voltage port 600b, ground.

When the state changes from the first state to the second state, the following conditions are true:

vglt=~2.4 v since InH_T is HI and InH_F is LO, therefore FET MN0 610 is conducting;

vgrb=~0.0 v since InL_T is HI and InL_F is LO, therefore FET MP1 621 is also conducting;

vgrt=~1.6 v since InH_T is HI and InH_F is LO, therefore FET MN1 611 is not conducting; and, vglb=0.8 v since InL_T is HI and InL_F is LO, therefore FET MP0 620 is not conducting.

Therefore, when the state changes from the first state to the second stage, the direction of current propagation reverses through the 100Ω load 604 and flows from the first supply voltage port 600a, the 1.8 v supply, into device MN0 610 through port 600d, out_T, into the external 100Ω load 604, into port 600e, out_F, into device MP1 621, and then to the second supply voltage port 600b, ground.

Figure 6B:
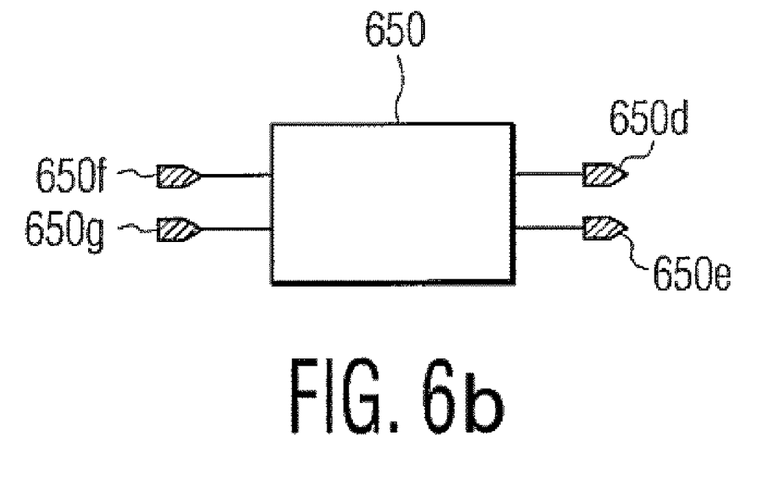

Due to the DC restoration that is implemented using the DC restoration circuitry, 603a and 603b, gate leakage on the gate terminals of FET devices 610, 611, 620 and 621 does not affect the device ON state, and thus the LVDS output signal does not degrade. Referring to FIG. 6b, a level shifting circuit 650 is shown, having input ports 650f and 650g coupled with first and second input ports 600f and 600g, is provided for receiving of input signals InL_T and InL_F and for level shifting these signals in potential to form level shifted signals InH_T and InH_F. These level shifted signals are provided from output ports, 650d and 650e, where these signals are shifted in potential from 1.8V, ImL_T and InL_F, to 3.3V, InH_T and InH_F, in order to drive the PMOS device DC restoration switches, MP10 622, MP20 623, MP30 624 and MP40 625 with minimal impact on timing.

Since the output driver section 600 does not use additional current to maintain a constant impedance between the supply voltage ports and ground, the current that is used is an approximately minimal theoretical current in order to achieve the LVDS differential voltage on the output ports, 600d and 600e. This current is typically 4 mA, where the power dissipation is the P=I*V=4 mA*1.8 v=7.2 mW In adding of the bias generator circuit, shown in FIG. 5, which consumes $\frac{1}{10}^{th}$ of the output signal current P=4.4 mA*1.8 v=7.92 mW. Advantageously, this typical power dissipation is the approximately minimum theoretical power consumption that is attainable using a given CMOS process technology, while keeping the LVDS within specification. Additionally, because AC coupling is used, which preserves the rising and falling edges, combined with thin oxide devices for the output follower stage 601, in conjunction with DC restoration, extremely high speeds for output driver section 600 are attainable.

Numerous other embodiments may be envisaged without departing from the spirit or scope of the invention.

What is claimed is:

1. A low voltage differential signaling (LVDS) output stage circuit comprising:
   a first supply voltage port for receiving of a first potential;
   a second supply voltage port for receiving of a second potential that is lower than the first potential;
   a differential input port, comprising a first input port and a second input port, for receiving of a differential input signal having transitions between the first and second potentials;
   a follower output stage formed with a thin oxide semiconductor manufacturing process comprising first and second NMOS pull-up FET devices and first and second PMOS pull-down FET devices disposed between the first and second supply voltage ports for being biased between the first and second potentials;
   a differential output port formed between junctions of the first NMOS pull-up FET device and the first PMOS pull-down FET device and the second NMOS pull-up FET devices and the second PMOS pull-down FET devices for providing of a low voltage differential signal therefrom;
   a first set of coupling capacitors disposed between the first input port and gate terminals of the first NMOS pull-up FET device and the first PMOS pull-down FET device;
   a second set of coupling capacitors disposed between the second input port and gate terminals of the second NMOS pull-up FET device and the second PMOS pull-down FET device; and
   DC restoration circuitry formed with a thick oxide semiconductor manufacturing process and coupled with each of the gate terminals of the FET devices for providing of a DC potential thereto.

2. The LVDS output stage circuit according to claim 1, wherein the first set of coupling capacitors comprise PMOS devices formed in an Nwell.

3. The LVDS output stage circuit according to claim 1, wherein the second set of coupling capacitors comprise PMOS devices formed in an Nwell.

4. The LVDS output stage circuit according to claim 1, wherein the devices formed using the thin oxide semiconductor manufacturing process operate at a potential of approximately 1.8V and the devices formed using the thick oxide semiconductor manufacturing process operate at a potential of approximately 3.3V.

5. A low voltage differential signaling (LVDS) output stage circuit comprising:
   a first supply voltage port for receiving of a first potential;
   a second supply voltage port for receiving of a second potential that is lower than the first potential;
   a differential input port, comprising a first input port and a second input port, for receiving of a differential input signal having transitions between the first and second potentials;
   a follower output stage comprising first and second NMOS pull-up FET devices and first and second PMOS pull-down FET devices disposed between the first and second supply voltage ports for being biased between the first and second potentials;
   a differential output port formed between junctions of the first NMOS pull-up FET device and the first PMOS pull-down FET device and the second NMOS pull-up FET devices and the second PMOS pull-down FET devices for providing of a low voltage differential signal therefrom;
   a first set of coupling capacitors disposed between the first input port and gate terminals of the first NMOS pull-up FET device and the first PMOS pull-down FET device;
   a second set of coupling capacitors disposed between the second input port and gate terminals of the second NMOS pull-up FET device and the second PMOS pull-down FET device; and,
   DC restoration circuitry coupled with each of the gate terminals of the FET devices for providing of a DC potential to the first and second sets of coupling capacitors in response to transitions in the differential input signal.

6. The LVDS output stage circuit according to claim 5, wherein the DC restoration circuitry comprises a first DC restoration circuit comprising first and second PFET devices with coupled drain terminals, wherein the first and second gate terminals thereof are for receiving of a level shifted differential input signal and the first and second source terminals thereof are for receiving of the first and second bias voltages, respectively, and where a common semiconductor substrate portion of the first and second PFET devices is biased at a third potential.

7. The LVDS output stage circuit according to claim 6, wherein the DC restoration circuitry comprises a second DC restoration circuit comprising third and fourth PFET devices with coupled drain terminals, wherein the third and fourth gate terminals thereof are coupled with the second and first gate terminals of the second and first PFET devices for receiving of the level shifted differential input signal and the first and second source terminals thereof are for receiving of the first and second bias voltages, respectively, and where a common semiconductor substrate portion of the third and fourth PFET devices is biased at the third potential.

8. The LVDS output stage circuit according to claim 7, further comprising a level shifting circuit coupled with the differential input port for receiving of the differential input signal and for level shifting the differential input signal in potential to form the level shifted differential input signal for provision to the gate terminals of the first and second PFET devices and to the gate terminals of the fourth and third PFET devices, which are coupled with the gate terminals of the first and second PFET, respectively.

9. The LVDS output stage circuit according to claim 7, further comprising: a third supply voltage port for receiving of a third potential that is higher than the first potential, the third supply voltage port coupled with the common semiconductor substrate portion for biasing thereof at the third potential.

10. The LVDS output stage circuit according to claim 9, further comprising a bias voltage generator circuit for providing of the first bias voltage to the source terminals of the first and third PFET devices and for providing of the second bias voltage to the source terminals of the second and fourth PFET devices.

11. The LVDS output stage circuit according to claim 10, wherein the first bias voltage is approximately 2.4V and the second bias voltage is approximately 1.6V.

12. The LVDS output stage circuit according to claim 7, wherein the DC restoration circuitry comprises a third DC restoration circuit comprising a first NFET device having a first drain terminal and a second NFET device having a second drain terminal with coupled source terminals, wherein the gate terminals thereof are for receiving of the differential input signal and the first and second drain terminals thereof are for receiving of third and fourth bias voltages, respectively.

13. The LVDS output stage circuit according to claim 12, wherein the DC restoration circuitry comprises a fourth DC restoration circuit comprising a third NFET device, having a third drain terminal and a third gate terminal, and a fourth NFET device, having a fourth gate terminal and a fourth drain terminal, with coupled source terminals, wherein the third and fourth gate terminals thereof are coupled with the second and first gate terminals of the second and first NFET devices, respectively, for receiving of the differential input signal and the first and second drain terminals thereof are for receiving of the third and fourth bias voltages, respectively.

14. The LVDS output stage circuit according to claim 13, further comprising a bias voltage generator circuit for providing of the third bias voltage to the first and third drain terminals of the first and third NFET devices and for providing of the fourth bias voltage to the second and fourth drain terminals of the second and fourth NFET devices.

15. The LVDS output stage circuit according to claim 14, wherein the third bias voltage is approximately 0.8V and the fourth bias voltage is approximately 0V.

16. The LVDS output stage circuit according to claim 5, wherein the differential output port comprises a first output port formed at a junction of the first NMOS pull-up FET device and the first PMOS pull-down FET device, wherein an impedance of the first output port with respect to the first supply voltage port is approximately 50 Ohms.

17. The LVDS output stage circuit according to claim 5, further comprising a semiconductor die, wherein the second NMOS pull-up FET device is integrated into the semiconductor die using an approximately 0.18 micron process wherein a width of the second NMOS pull-up FET is approximately 98 microns and a length thereof is approximately 0.4 microns.

18. The LVDS output stage circuit according to claim 16, wherein the differential output port comprises a second output port formed at a junction of the second NMOS pull-up FET device and the second PMOS pull-down FET device, wherein an impedance of the second output port with respect to the second supply voltage port is approximately 50 Ohms.

19. The LVDS output stage circuit according to claim 5, further comprising a semiconductor die, wherein the first PMOS pull-down FET device is integrated into the semiconductor die using an approximately 0.18 micron process wherein a width of the first PMOS pull-down FET is approximately 272 microns and a length thereof is approximately 0.4 microns.

20. The LVDS output stage circuit according to claim 5, wherein the differential output signal comprises a peak to peak voltage of less than 400 mV.

21. The LVDS output stage circuit according to claim 5, further comprising a load having an impedance of approximately 100 Ohms disposed across the differential output ports, wherein the differential output ports provide a current of approximately 4 mA through the load.

22. The LVDS output stage circuit according to claim 5, wherein each coupling capacitor is characterized by a coupling capacitance and each of the FET devices have a gate capacitance, wherein the coupling capacitance is approximately 0.8 times that of the gate capacitance.

23. The LVDS output stage circuit according to claim 5, wherein the follower output stage and the first and second sets of coupling capacitors are integrated onto a semiconductor die using a thin oxide semiconductor process and the DC restoration circuitry is integrated onto the same semiconductor die using a thick oxide semiconductor process that is thicker than the thin oxide semiconductor process.

24. A method comprising:
  AC coupling of a differential input signal to a follower output stage, the AC coupling performed using higher speed lower voltage devices;
  DC restoring of a portion of the differential input signal to the follower output stage, the DC restoring performed using slower higher voltage devices;
  summing the AC coupled differential input signal and the DC bias voltage together in the follower output stage to form a differential output signal; and
  level shifting of the differential input signal to form a level shifted differential input signal that is at a higher potential than the differential input signal.

25. The method according to claim 24, wherein the AC coupling is performed using thin oxide devices.

26. The method according to claim 24, wherein the DC restoring is performed using thick oxide devices.

27. The method according to claim 24, wherein the follower output stage comprises: providing first and second NMOS pull-up FET devices and first and second PMOS pull-down FET devices.

28. The method according to claim 27, further comprising propagating a substantial current through at least one of the second NMOS pull-up FET device and the second PMOS pull-down FET for providing of a fixed impedance for the differential output signal.

29. The method according to claim 27, further comprising:
  providing first and second DC restoration circuits coupled with the gate terminals of the first and second NMOS pull-up FET device; and,
  receiving of the level shifted differential input signal by the first and second DC restoration circuits.

30. The method according to claim 29, further comprising:
providing a first supply voltage port;
providing a second supply voltage port; and,
providing an impedance that is approximately fixed in nature between coupled source terminals of the first NMOS pull-up FET device and the first PMOS pull-down FET device and the second supply voltage port.

31. The method according to claim 29, further comprising:
providing a first supply voltage port;
providing a second supply voltage port; and,
providing an impedance that is approximately fixed in nature between coupled source terminals of the second NMOS pull-up FET device and the second PMOS pull-down FET device and the first supply voltage port.

32. The method according to claim 24, further comprising:
providing third and fourth DC restoration circuits coupled with the gate terminals of the first and second PMOS pull-down FET device; and,
receiving of the differential input signal by the third and fourth DC restoration circuits.

33. The method according to claim 24, wherein the differential output signal is characterized by switching that occurs at approximately 2 Gbits/s.

34. The method according to claim 24, wherein a potential difference between output signals forming the differential output signal is less than 400 mV.

35. A LVDS output stage circuit comprising:
means for AC coupling of a differential input signal to a follower output stage, the AC coupling performed using higher speed lower voltage devices;
means for DC restoring of a portion of the differential input signal to the follower output stage, the DC restoring performed using slower higher voltage devices;
means for summing the AC coupled differential input signal and the DC bias voltage together in the follower output stage to form a differential output signal; and
means for level shifting the differential input signal to form a level shifted differential input signal that is at a higher potential than the differential input signal.

* * * * *